United States Patent
Shia et al.

(10) Patent No.: US 9,535,095 B2
(45) Date of Patent: Jan. 3, 2017

(54) ANTI-ROTATION FOR WIRE PROBES IN A PROBE HEAD OF A DIE TESTER

(71) Applicants: David Shia, Hillsboro, OR (US); Todd P. Albertson, Warren, OR (US); Keith J. Martin, Hillsboro, OR (US)

(72) Inventors: David Shia, Hillsboro, OR (US); Todd P. Albertson, Warren, OR (US); Keith J. Martin, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 427 days.

(21) Appl. No.: 14/013,422

(22) Filed: Aug. 29, 2013

(65) Prior Publication Data

US 2015/0061713 A1    Mar. 5, 2015

(51) Int. Cl.
*G01R 1/073*    (2006.01)
*G01R 1/067*    (2006.01)
*G01R 3/00*    (2006.01)

(52) U.S. Cl.
CPC ....... *G01R 1/07371* (2013.01); *G01R 1/06733* (2013.01); *G01R 3/00* (2013.01); *Y10T 29/49124* (2015.01)

(58) Field of Classification Search
CPC ... G01R 1/06705; G01R 3/00; G01R 1/06733; G01R 1/067; Y10T 29/49124
USPC .......................................... 324/750.16; 29/829
See application file for complete search history.

(56) References Cited

U.S. PATENT DOCUMENTS

| | | | | | |
|---|---|---|---|---|---|
| 5,952,843 | A | * | 9/1999 | Vinh ................... | G01R 1/07357 324/72.5 |
| 6,144,212 | A | * | 11/2000 | Mizuta ............... | G01R 1/07378 324/755.04 |
| 2001/0040460 | A1 | * | 11/2001 | Beaman ............. | G01R 1/07378 324/762.02 |
| 2004/0169521 | A1 | * | 9/2004 | Rincon ............... | G01R 1/07378 324/756.03 |
| 2005/0110506 | A1 | * | 5/2005 | Crippa ............... | G01R 1/06733 324/754.11 |
| 2006/0108678 | A1 | * | 5/2006 | Kumar ............... | B23K 35/0222 257/690 |
| 2007/0193326 | A1 | * | 8/2007 | Bogart ............. | A61B 17/06066 72/340 |
| 2009/0096474 | A1 | * | 4/2009 | Rogers ................. | G01R 1/0735 324/750.19 |
| 2010/0213960 | A1 | * | 8/2010 | Mok ....................... | G01R 35/00 324/762.03 |
| 2012/0319711 | A1 | * | 12/2012 | Hung et al. ........ | G01R 1/07371 324/750.16 |

* cited by examiner

*Primary Examiner* — Melissa Koval
*Assistant Examiner* — Courtney McDonnough
(74) *Attorney, Agent, or Firm* — Blakely, Sokoloff, Taylor & Zafman LLP (57) ABSTRACT

Wire probes are described that resist rotation during assembly into a probe head of a die tester. One example includes probe wires with a protrusion at a pre-determined position along the length of the wire. A probe substrate with pads on one side each to attach to and electrically connect with a probe wire and a pads on the opposite side to connect to test equipment and a probe holder above the substrate with holes. Each hole holds a respective one of the probe wires against the probe substrate. Each hole also has a key to mate with a protrusion of a respective probe wire so that the protrusions engage the keys to prevent rotation of the respective wire.

18 Claims, 6 Drawing Sheets

ANTI-ROTATION FOR WIRE PROBES IN A PROBE HEAD OF A DIE TESTER

FIELD

The present specification relates to the testing and sorting of semiconductor and micromechanical dies and, in particular, to a test probe head for testing equipment.

BACKGROUND

In the manufacture of microelectronic devices, such as processors, controllers, and memory, the desired structures are formed on a wafer. Individual dies are cut from the wafer and then sealed into a package. The package has an array of pins, pads, or lands that make contact with the rest of the device, typically through a printed circuit, board to allow the die to be operated while within the package. Before packaging, either as part of a wafer or an individual die, each die is tested to determine whether it has been manufactured correctly and operates as intended. In some cases, the dies are also sorted based on performance.

To perform the tests, some dies have lands or pads specifically designed into the die for test purposes. Pins or probes are applied to the lands or pads and signals are sent or received through the pins to test the die. For a more complex die, more pins are used. Similarly for denser circuitry on the die, the pins are closer together.

The test probes are attached to a substrate that holds each probe in the proper position with respect to each other probe so that when the tester is pressed against the pads on the die, each probe will contact its respective pad. The probes are resilient so that when the probes are pressed against the die the pressure of the contact is determined by the resiliency of the probe, not the pressure of from the test equipment. Each test probe has a limited number of die tests that it can perform, after which it must be replaced. The replacement cost of each test probe is therefore a factor in the cost of die manufacturing.

The substrate and the probes are typically separately manufactured using a MEMS (microelectromechanical systems) process, or a process similar to how transistors are made. Once the probes are made, they are assembled onto the space transforming substrate.

The individual probes are each manually inserted into the guide plate to contact the substrate. Each probe has a curve in its middle section so that when pressed against the die it will bend. The probes must all bend in the same direction so that they do not contact each other during use, possibly creating connections that destroy the die or the probe. Several thousand to tens of thousands of probes may be placed into a guide plate to build one sort tester for a microprocessor. This number is expected to increase as die complexity and density increases from today's probe counts. The process is performed manually in part due the shape of the probe. The central curve increases the complexity of the probes being inserted in an automated process.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

A probe head of die sort tooling has a large number of formed wire probes inserted into the holes of a probe holder. Square wires may be inserted into square holes in the probe head, but square wires are expensive to manufacture and require precise alignment. Round wires are easier to manufacture and have a more stable and consistent structure. If round probe wires are used with a round hole in the probe holder, then the probe wires can rotate. Each wire may rotate a different amount. This can create many issues during and after the assembly of the probe head. A rotated probe wire may cause interference with neighboring probes knocking them out of position. A rotated probe wire may block access to neighboring holes preventing additional probe wires from being inserted into the other holes of the probe holder. The location of a probe wire tip may also move when the wire is rotated rendering the probe head useless Mechanical keying may be used to limit or prevent the rotation of the wires. Features on the probe body and the probe holder may be made such that they interlock when the probe body is inserted into the holder. By forming a keying feature into a substrate and a corresponding tab into a wire, round wires may be attached to a probe head without risk of them rotating to collide with each other. This also allows more probes to be attached in denser arrays at lower cost. This approach drastically reduces the cost of test probe arrays by allowing round wires to be used and decreases assembly complexity providing a substantial reduction in the cost of microelectronic device fabrication.

In some embodiments, the wires are inserted into holes in a probe head and then soldered into place. After the solder has solidified, the probe wires are securely held in place against rotation and against lateral movement. In this case, any key feature is required only to hold the wire in place until the solder hardens.

In some embodiments, the probe holder holes are filled with a viscous fluid. The viscous force from the fluid creates enough resistance to movement to prevent the probe from rotating. However, the typical viscous fluid evaporates off completely before the solder in the probe head reaches reflow temperature. The probe wires are free to rotate before the reflow temperature and during the subsequent cool down. As a result, the viscous fluid works only at relatively low temperatures (~150° C. and lower). In addition, the typical viscous fluid coats the body of the probe wire which leads to preferential wetting of the solder onto the probe body instead of onto a solder pad on the substrate. Mechanical keying is effective across a wide temperature range.

Figure 1:
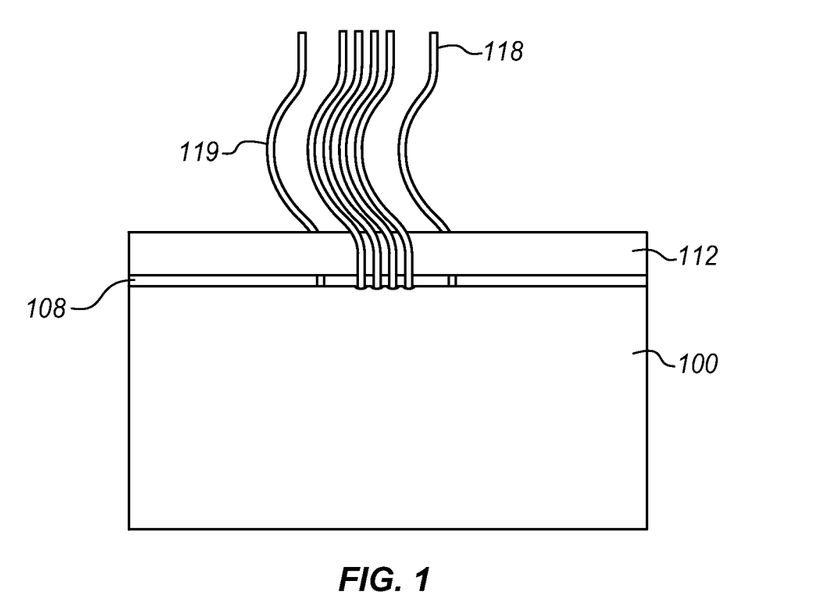
FIG. 1 is partial side cross-sectional diagram of a test probe head according to an embodiment of the invention.

FIG. 1 shows a probe test head with a space transformer substrate 100, a probe holder 112 and fully formed test probes 118. Only a few test probes are shown for simplicity. A probe head may have hundreds or thousands of test probes. Each probe wire has a similar central bend 119 to provide a spring effect. This allows the probes to exert a spring force against the die when the probe head is pushed up against the die. It also allows each probe to independently compensate for variations in distance between the substrate and the respective die pad. Any non-uniformity in the surface of either surface can be compensated. In addition if the two parts are not precisely co-planar, that is if one side of the die is closer to the substrate than the other, then the probe tips are also able to compensate.

Each probe wire may be soldered to a corresponding contact pad of the substrate 100, while the holder 112 helps to prevent the wires from bending and from being pushed off their solder connections. The gap between the substrate and the holder may be filled in with a dielectric underfill 108. The underfill further secures the wires in place and isolates each wire from the other.

The test probe design shows a balance between strength, spring force and displacement under load. The probe tips bend enough to allow all of the probe tips to make a good contact with the die without requiring too much force and without bending so much as to touch another test probe. The arc shaped bend 119 shown in the figures provides a good balance for a 10-25 μm diameter wire and a lateral extension for the bend of about 75-150 μm. Depending on the particular wire shape desired the amount of bend, the thickness, and the length of the probe test wires may be varied.

A variety of probe tip enhancements may be applied such as tip shaping, plating, etc. The particular choice of tip enhancements may be adapted to suit the particular form of the die being used. For example, the tips of the test probes may be exposed to laser oblation using a laser tool. This provides a small precise electrical contact surface that is well suited to mate with the dies. Each tip may have a point to contact a die pad and an oblation area that leads to the rest of the wire. The thicker body of the wire provides the necessary strength and durability, while the point provides a better tailored contact surface.

Figure 2:
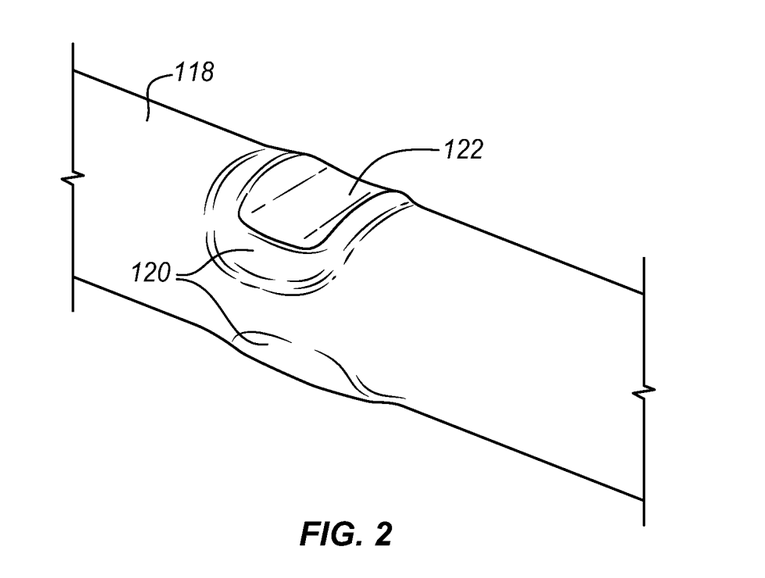
FIG. 2 is a perspective view of a portion of a probe wire with protrusion features according to an embodiment of the invention.

FIG. 2 shows detailed view of a single probe wire 118 with flanges 120 formed in a particular location along its length and corresponding depressions. As shown, there is an upper depression 122 and a lower depression (not shown) and a flange on either side of each depression. If the flanges are formed by compression, then dies may be used to compress the wire material into the depression and drive some of the material of the wire out to form the flanges.

The flanges of FIG. 2 serve as interlocking features on the probe body. The interlock feature consists of four protrusions 120 on the probe body 118. In one example, the four protrusions are about 25 μm in height and extend 8 to 10 μm outward.

Figure 3A:
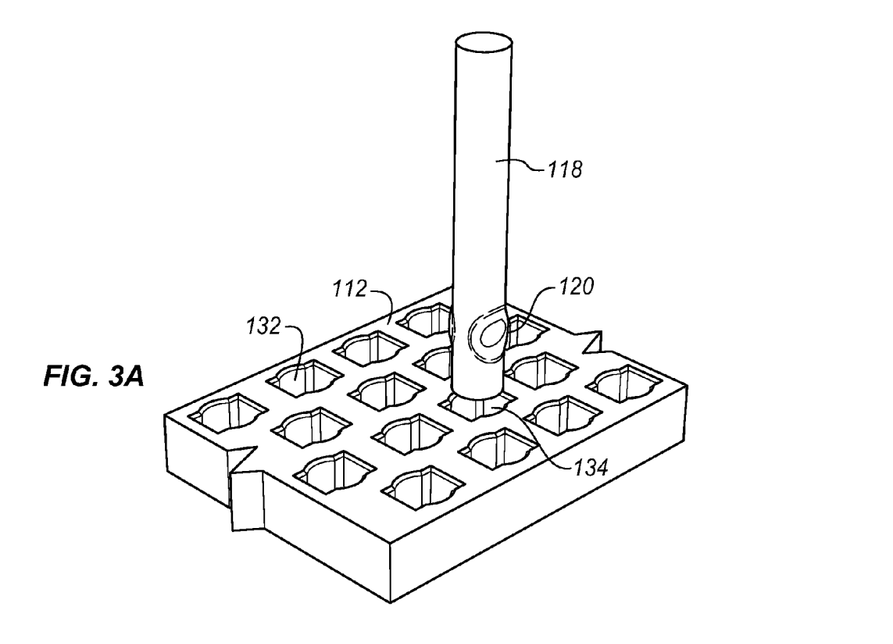
FIG. 3A is a perspective view diagram of a probe wire being inserted into a probe head according to an embodiment of the invention.

In FIG. 3A, the probe wire is inserted into an opening in the probe holder 112. The opening 132 has been formed as a round opening for the wire with keys 134 in the form of slots on four corners of the opening. The keys are sized in order to correspond with and receive the protrusions 120 of the wire. The interlocking key feature in the probe-holder holes are shown in this example as slots. Instead of a circular hole, the holes have two straight edges. The holes may be formed by any of a variety of different machining processes including photolithography with chemical etch and laser machining.

Figure 3B:
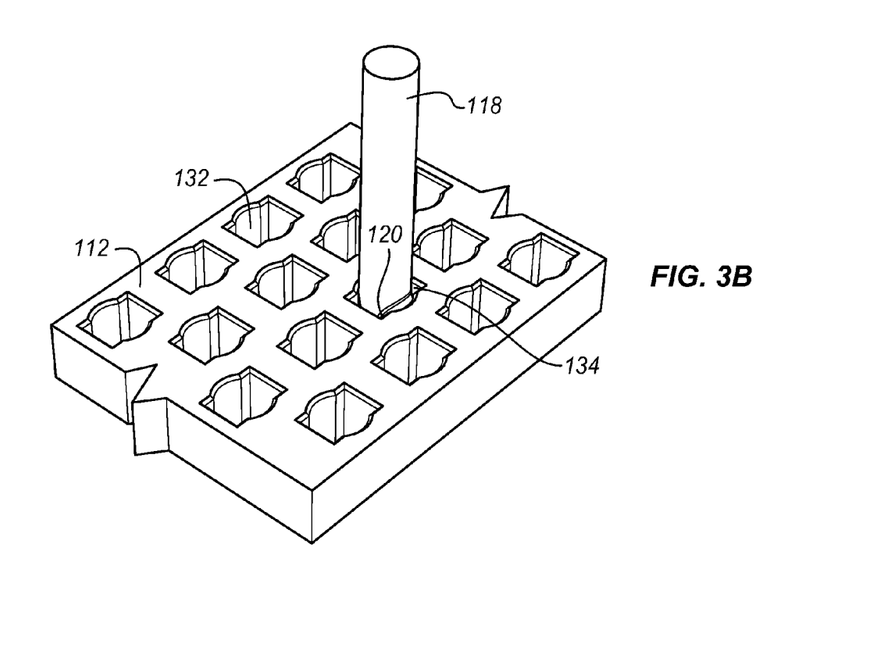
FIG. 3B is a perspective view diagram of a probe wire inserted into a probe head according to an embodiment of the invention.

As shown in FIG. 3B, when the flanges engage the slots, the flanges prevent the wire from rotating. The amount of rotation that is permitted by the flanges depends upon how closely the shapes of the flanges match the shapes of the slots. As shown in FIG. 3B, the key wires engage the key hold to prevent rotation of the wire within the probe holder.

As shown, when the probe is inserted into the probe-holder hole under nominal conditions, the protrusion is only a few microns away from one of the straight edges of the hole. Whenever the probe body is perturbed and starts to rotate, one of the four protrusions comes into contact with one of the straight edges of the hole. The resultant contact force will generate a counter moment to prevent further rotation of the probe.

In use, the wires will be pushed into and through the probe holder to the substrate 100 where the end of each wire will contact a corresponding pad on the substrate 100. The flanges are formed in a location along the length of the wire so that when the end of the wire contacts the pad, the flanges will engage the slots in the probe holder. In some probe heads, this distance is 100 to 150 μm from one end of the probe wire. Solder may be applied to the pad before the wire reaches it and the probe holder holes 132 may be coated with flux or solder or both.

The holes in the probe holder are positioned to align precisely with test pads or locations on the die that is to be tested. A larger number of holes will provide a larger number of test points for more thorough testing of the die. The holes may be as close as 100 μm apart from center to center, depending on the implementation. While the holes are shown as having a regular pattern and even spacing, the holes may be irregularly positioned in order to mate with designed test points on the device to be tested.

After all of the wires have been inserted, then the substrate, probe holder and wires may be placed in a reflow oven to melt the solder and electrically connect each wire to its respective pad, however the invention is not so limited. When the solder sets, it will also hold the wire in place. While the solder is first melting and then cooling, the flanges are able to hold the wire in place against rotation.

Figure 4:
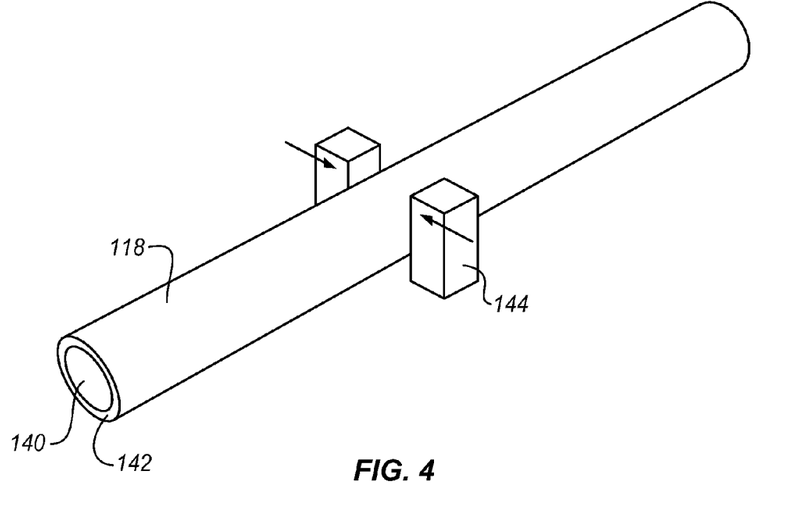
FIG. 4 is a perspective view diagram of stamping opposite sides of a probe wire to create protrusion features according to an embodiment of the invention.

FIG. 4 is a diagram of one way to form flanges or ribs on a round wire. Two blocks 144 are used on each side of the probe body 118 to pinch the probe body by striking the two dies against it. When the blocks move inward, they punch the wire and displace the material on the probe body forcing it outward to form the protruding features (see e.g. FIG. 2). The protruding features on the probe body protrude in a direction perpendicular to the inward moving direction of the forming block.

The round wire 118 is placed between a pair of dies 144. The pair of dies are placed a pre-determined distance from the end of the wire. This position corresponds with the position of the probe holder so that the flanges engage the notches in the probe holder. The dies are driven together into the wire to compress the wire and drive metal away from the dies on either side of each die. Such a process allows a flange to be formed on the wire in a small area of the wire. The cross sectional view of the prove wire in FIG. 4 also shows that in one example, the probe wire may have a solid spring steel core 140 that is coated with a softer and more highly conducting metal, such as copper, silver, gold, or any other desired material. If exposed, the coating provides a softer and more conductive contact with a land or pad on the DUT (Device Under Test). The coating also allows for the wire tip to be sharpened by removing some of the coating.

Figure 5A:
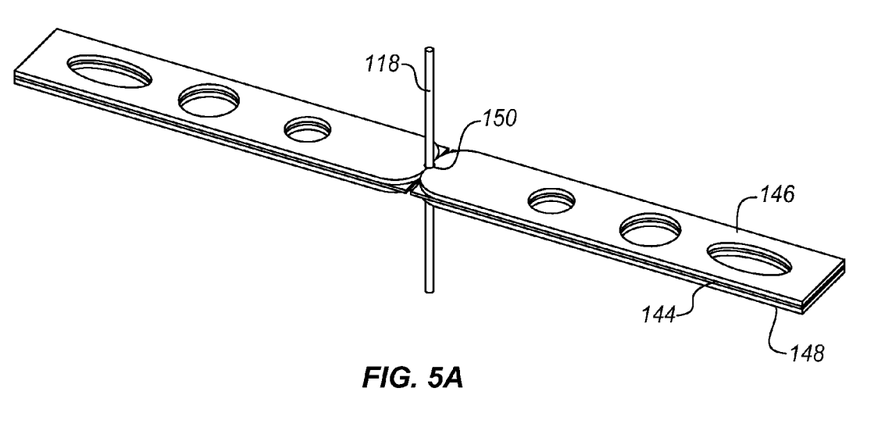
FIG. 5A is a perspective view diagram of stamping opposite sides of a probe wire using stacked flat dies according to an embodiment of the invention.

FIG. 5A is a perspective diagram of an example of a stamping die that may be used to create flanges on the probe wires of the present invention by striking the wire. However, the invention is not limited to die compression, punching, or the particular plate stamping approach described herein. The probe wire 118 is brought between two sets of plates. A middle plate 144 provides the stamping die or tool as shown in FIG. 4. The middle plate is sandwiched between an upper plate 146 and a lower plate 148. The upper and lower plates stiffen the middle plate and act as stops to limit the travel of the two middle plates. The middle plates are allowed to travel into the probe wire for a distance limited by the other two plates. This controls the size of the flanges and prevents the wire from being inadvertently cut or weakened.

The three plates for each side may be attached by welding, by rivets, bolts, or in any of a variety of other ways. A probe forming machine may also have a system for driving the dies into the probe wire, a probe wire holder and any of a variety of other structures. The probe forming machine may treat each wire individually or punch many wires simultaneously with multiple set of dies. Additional processes may be applied to the probe wires at the same time. The probe wires may also be bent, sharpened, coated or formed in other ways at the same time or in the same machine.

Figure 5B:
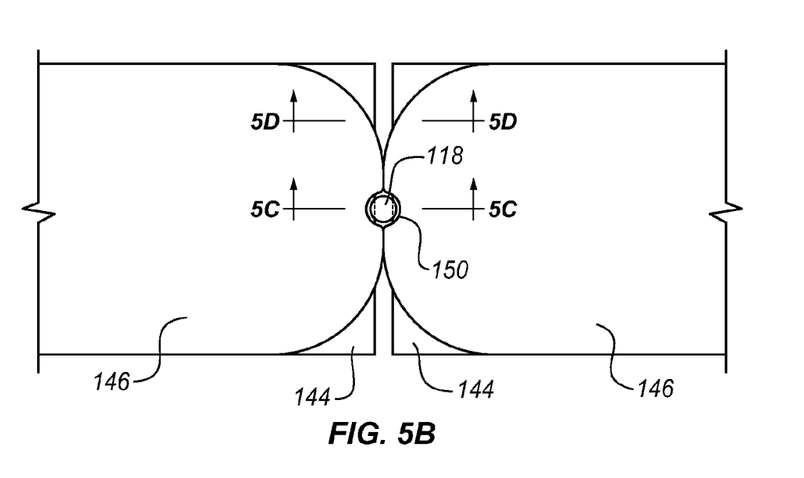
FIG. 5B is a top elevation view of stamping opposite sides of a probe wire using stacked flat dies according to an embodiment of the invention.

FIG. 5B is a top elevation view of a probe wire and the probe forming plates of FIG. 5A. The wire is held in place by any type of suitable holder (not shown). The middle plates 144 are driven against the wire, until the upper plates 146 meet. The upper plates have an opening 150 that allow the probe wire to extend through the plates after the plates have come together.

Figure 5C:
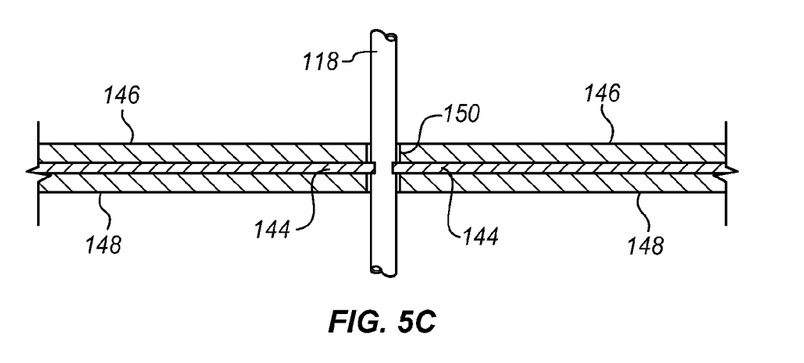
FIG. 5C is a side cross sectional view along line 5C of FIG. 5A of stamping opposite sides of a probe wire using stacked flat dies according to an embodiment of the invention.

FIG. 5C is cross-sectional side view of the probe wire 118 and the plates at the center of the wire . . . . The middle stamping plates press against the wire to create flanges as shown in FIG. 2. The upper and lower plates do not touch the wire due to the curve 150. To form the protruding features, a composite wire is first inserted into a probe body pinching tool. When the wire is situated properly in the forming block, the pinching tool is a pre-determined distance from the end of the wire. The dies are pressed into the wire until the dies come to a hard stop. In this example, the protrusions are pushed out to protrude on the probe body in a direction perpendicular to the forming direction.

Figure 5D:
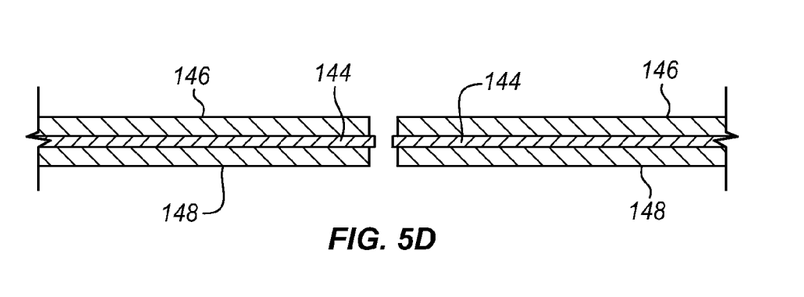
FIG. 5D is a side cross sectional view along line 5D of FIG. 5B of stamping opposite sides of a probe wire using stacked flat dies according to an embodiment of the invention.

FIG. 5D is a cross-section side view of the plates at a position removed from the wire. The plates are in the same position in FIGS. 5A, 5B, 5C, and 5D. The upper 146 and lower 148 plates are driven into contact so their ends are abutting each other. The stops movement of the plates. The middle plates 144, however, are not in contact leaving a gap between the two plates. This gap is large enough to accommodate the wire and is the same distance as shown in FIG. 5C between the two middle plates.

Figure 6:
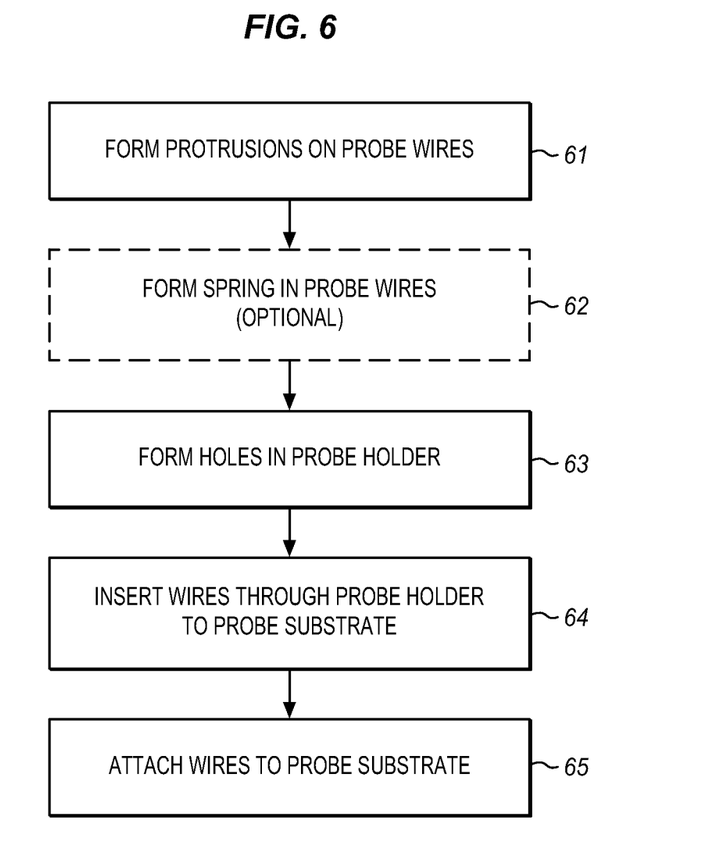
FIG. 6 is a process flow diagram of forming a probe head according to an embodiment of the invention.

FIG. 6 describes a method of fabricating a test probe head having a plurality of resilient test probes as shown above. First at 61, protrusions are formed on each of a plurality of wires. The protrusions are formed at a pre-determined position along the length of each wire so that the features will line up with the probe holder when the probe head is assembled. The protrusions may be formed in any of a variety of different ways including the transverse stamping shown above e.g. in FIGS. 4 and 5C. With the stamping process two dies are simultaneously drive in to the wire to form flanges that protrude out on either side of each die.

At 62, a spring feature is optionally formed in each wire. This may be in the form of the bend shown in FIG. 1 or in any other desired shape or form, depending on the nature of the wire, the DUT, the testing apparatus and the tests that are to be performed. The ends of the wires may also be shaped in any of a variety of different ways. The ends opposite the probe substrate may be shaped to form tips that better contact the DUT. These contact ends may be shaped before or after being inserted into the probe holder and attached.

At 63 a corresponding plurality of holes are formed in a probe holder. Each of the holes has a key to mate with a respective protrusion feature of a wire. The holes may be in the form of squared-off edges as shown or in any of a variety of other shapes designed to engage the protrusion features. The illustrated holes have a slot at each corner to engage a flange when the wire is inserted. The order of these operations of forming the wires and the probe holder may be performed in any order and are not limited to the order shown herein.

At 64, the wires are each inserted through respective hole of the probe holder. They are pushed through until one end of the wire contacts the contact surface of probe head substrate. At this point the protrusions of the wires will engage the keys of the probe holder to prevent the wires from rotating. The wires may be rotated slightly to press the protrusion into the key and lock the wire in place.

At 65, the wires are attached to the surface of the substrate so that the wires operate as test probes. The wires may be attached by soldering the wires onto pads of the substrate using a reflow furnace. In some examples, the pads of the test probe are paste printed with solder paste. The wire then lands in the solder paste when it is inserted. The probe holder may be coated in a rosin or other wetting fluid so that the wire is wetted as it is inserted through the holder. Once the wires are inserted, the whole assembly may then be placed into the reflow furnace. The test probe head may be connected to automated test equipment through the probe substrate and the test probe head then pressed against a die for testing.

Figure 7:
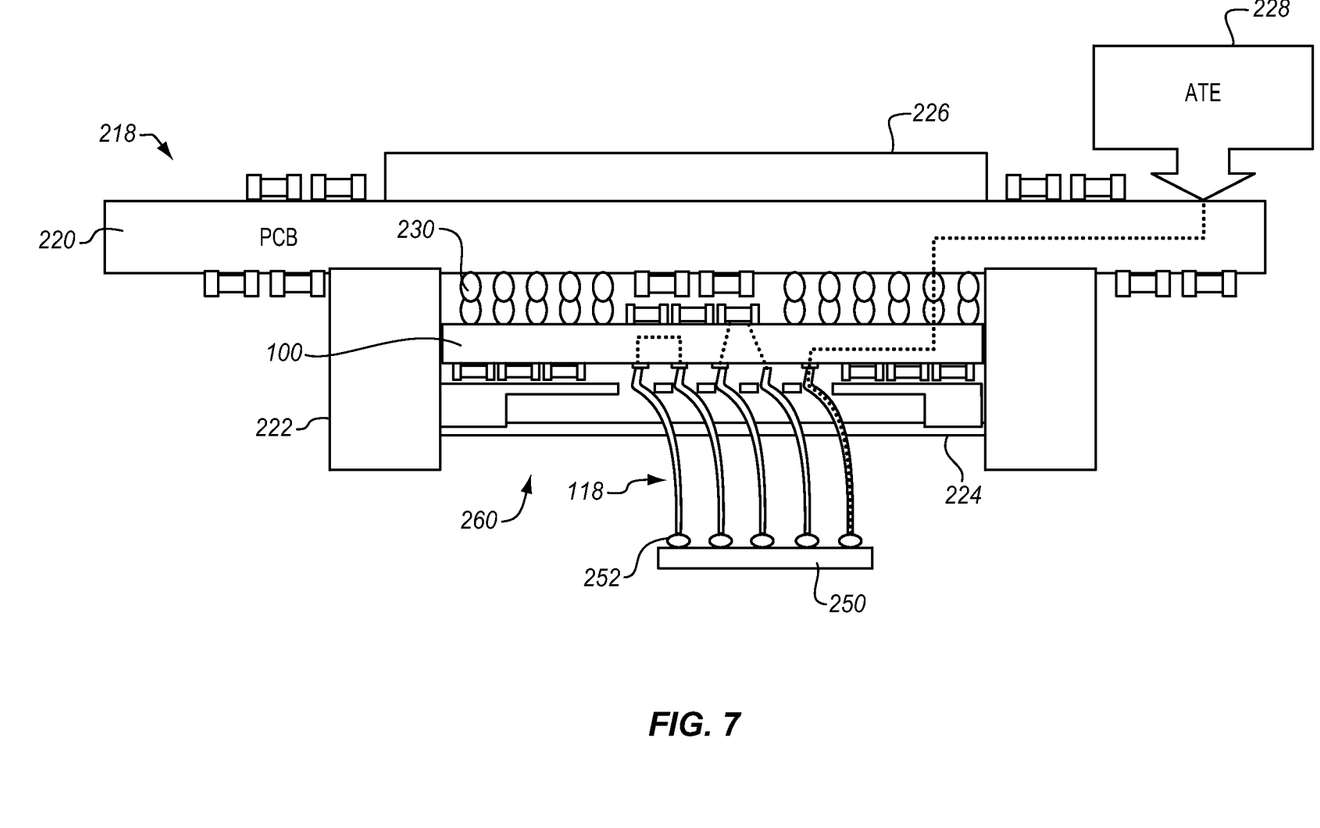
FIG. 7 is a side cross-sectional diagram of testing equipment using a probe head formed according to an embodiment of the invention.

FIG. 7 is a an example of testing equipment capable of using the formed test probes 118 and space transformer 100 in a testing probe head 260 to test and sort dies 250 of various types. The space transformer 100 has a contact pad array formed of the test probes as described above. The test probes are arranged in a pattern to match with test sites on the device under test 250, such as a die. The wire test probes 118 each have a lower end configured and arranged for mating with a corresponding test pad 252 on the DUT 250 to be tested. The test probes 118 have a pitch that matches the pitch of the test pads 252 on the DUT 50.

A probe test head 260 carries the substrate and the test probes on a testing PCB (Printed Circuit Board) 200, which is strengthened by stiffening hardware 226. A mounting ring 222 holds the testing probe head 260 supported by the mounting ring to the PCB. A bottom side holder 224, attached to the mounting ring, secures the substrate 100 within the test head. The space transformer substrate 100, which, as described above, may be a multi-layered organic (MLO) or multi-layered ceramic (MLC) interconnect substrate has a connection side 230 opposite the test probes. This connection side is formed using pads that are created when the substrate is originally manufactured. In the illustrated example, the connections are in a BGA (Ball Grid Array) for mating with corresponding contacts on the PCB 220. The PCB then connects to ATE (Automated Test Equipment) 228 which drives the test and measures the results through the test probes.

The example of FIG. 10 is a generalized diagram of test equipment to show a context for use of the test probes produced as described above. The test probes may be used in many other types of test equipment, depending on the nature of the DUT and the type of test to be performed. The test probes may also be used to test dies that are packaged or dies that are packaged together with other dies.

It is to be appreciated that a lesser or more equipped prober former plate, forming jig probe head and testing apparatus than the examples described above may be preferred for certain implementations. Therefore, the configuration of the exemplary systems and components may vary from implementation to implementation depending upon numerous factors, such as price constraints, performance requirements, technological improvements, or other circumstances.

Embodiments may be adapted to be used with a variety of different probe wires, devices under test and space transformer substrates using various types of testing equipment for different implementations. References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, the specific location of elements as shown and described herein may be changed and are not limited to what is shown. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus with a plurality of probe wires, each wire having a protrusion at a pre-determined position along the length of the wire, a probe substrate having a plurality of pads on one side each to attach to and electrically connect with a probe wire and a plurality of plurality of pads on the opposite side to connect to test equipment, and a probe holder above the substrate having a plurality of holes, each hole to hold a respective one of the plurality of probe wires against the probe substrate, each hole also having a key to mate with a protrusion of a respective probe wire so that the protrusions engage the keys to prevent rotation of the respective wire.

In some embodiments, the probe holder is above the carrier by a distance corresponding to the pre-determined position of the protrusion along the length of each wire. The protrusion comprises four flanges for each wire, each flange being on one of four opposing corners of the wire and wherein each hole has a corresponding key in the form of a slot at each of four corners of each hole. The wires are attached to the probe substrate by being reflow soldered to each respective pad. The flanges are formed by stamping the wire on two sides.

Some embodiments pertain to a die test system for testing semiconductor dies using a probe head. The system has a testing probe head having a plurality of probe wires, each wire having a protrusion at a pre-determined position along the length of the wire, a probe substrate having a plurality of pads on one side each to attach to and electrically connect with a probe wire and a plurality of pads on the opposite side to connect to test equipment, and a probe holder above the substrate having a plurality of holes, each hole to hold a respective one of the plurality of probe wires against the probe substrate, each hole also having a key to mate with a protrusion of a respective probe wire so that the protrusions engage the keys to prevent rotation of the respective wire. The system also has a stiffened board to carry the testing probe head, a clamp to hold the testing probe head against the stiffened board, and automated test equipment connected to the probe substrate to drive a test and measure the results through the test probes.

In some embodiments, the probe wires are laser ablated after being formed. The probe wires are bent to provide resiliency in use. The probe wires are soldered to the pads of the probe substrate.

Some embodiments pertain to a method of fabricating a test probe head having a plurality of resilient test probes. The method includes forming protrusions on each of a plurality of wires at a pre-determined position on each wire, forming a corresponding plurality of holes in a probe holder, each of the holes having a key to mate with a respective protrusion, inserting each of the plurality of wires through a respective hole of the probe holder to contact a surface of a probe head substrate near the probe holder so that the protrusions engage the keys to prevent rotation of the respective wire, and attaching the wires to the surface of the substrate so that the wires operate as test probes.

In some embodiments, attaching the wires comprises inserting the wires to contact a solder ball on the probe substrate and passing the substrate and the plurality of wires through a reflow furnace to solder the wires to the substrate.

Some embodiments include shaping the ends of the wires before inserting the wires through the probe holder. Some embodiments include bending each of the plurality of wires to form a spring before inserting the wires through the probe holder.

In some embodiments, forming protrusions comprises stamping each wire with a flat die. Stamping comprises using two dies on opposite sides of the wire and simultaneously striking the wire on opposite sides of the wire. Forming protrusions comprises punching each wire simultaneously on opposite sides of the wire to compress the wire and drive the material of the wire out to form longitudinal flanges. Forming the plurality of holes comprises laser machining round holes with a slot at each of four opposing corners of the hole. Inserting the wires comprises driving the wires through the probe holder and applying a rotation to engage the protrusions in the slots.

What is claimed is:

1. An apparatus comprising: a plurality of probe wires each wire having first end to contact a die under test and a second end to attach to a probe substrate each wire having a protrusion at a pre-determined position along the length of the wire, the position being displaced from either end of the wire;
   a probe substrate having a plurality of pads on one side each to attach to and electrically connect with the second end of a respective probe wire and a plurality of plurality of pads on the opposite side of the probe substrate to connect to test equipment; and
   a probe holder above the substrate having a plurality of through holes each hole to hold a respective one of the plurality of probe wires against the probe substrate, each through hole also having a key to mate with a protrusion of a respective probe wire so that the protrusions engage the keys to prevent rotation of the respective wire.

2. The apparatus of claim 1, wherein the probe holder is above the probe substrate by a distance corresponding to the pre-determined position of the protrusions along the length of each wire.

3. The apparatus of claim 1, wherein the plurality of protrusions comprise four flanges for each wire each flange being on one of four opposing corners of the wire and wherein each hole has a corresponding key in the form of a slot at each of four corners of each through hole.

4. The apparatus of claim 1, wherein the wires are attached to the probe substrate by being reflow soldered to each respective pad.

5. The apparatus of claim 1, wherein the flanges are formed by stamping the wire on two sides.

6. A die test system for testing semiconductor dies using a probe head the system comprising:
   a testing probe head having a plurality of probe wires each wire having first end to contact a die under test and a second end to attach to a probe substrate each wire having a plurality of protrusion at a pre-determined position along the length of the wire the position being displaced from either end of the wire, a probe substrate having a plurality of pads on one side each to attach to and electrically connect with the second end of a respective probe wire and a plurality of pads on the opposite side of the probe substrate to connect to test equipment, and a probe holder above the substrate having a plurality of holes each through hole to hold a respective one of the plurality of probe wires against the probe substrate each through hole also having a key to mate with a protrusion of a respective probe wire so that the protrusions engage the keys to prevent rotation of the respective wire;
   a stiffened board to carry the testing probe head;
   a clamp to hold the testing probe head against the stiffened board; and
   automated test equipment connected to the probe substrate to drive a test and measure the results through the test probes.

7. The system of claim 6, wherein the probe wires are laser ablated after being formed.

8. The system of claim 6, wherein the probe wires are bent to provide resiliency in use.

9. The system of claim 6, wherein the probe wires are soldered to the pads of the probe substrate.

10. A method of fabricating a test probe head having a plurality of resilient test probes, the method comprising:
    forming a plurality of protrusions on each of a plurality of wires at a pre-determined position on each wire each wire having first end to contact a die under test and a second end to attach to a probe substrate the position being displaced from either end of the wire;
    forming a corresponding plurality of through holes in a probe holder each of the through holes having a key to mate with a respective protrusion;
    inserting each of the plurality of wires through a respective through hole of the probe holder to contact a surface of a probe head substrate near the probe holder with the second end of each respective probe wire so that the protrusions engage the keys to prevent rotation of the respective wire; and
    attaching the wires to the surface of the substrate so that the wires operate as test probes.

11. The method of claim 10, wherein attaching the wires comprises inserting the wires to contact a solder ball on the probe substrate and passing the substrate and the plurality of wires through a reflow furnace to solder the wires to the substrate.

12. The method of claim 10, further comprising shaping the ends of the wires before inserting the wires through the probe holder.

13. The method of claim 10, further comprising bending each of the plurality of wires to form a spring before inserting the wires through the probe holder.

14. The method of claim 10, wherein forming protrusions comprises stamping each wire with a flat die.

15. The method of claim 14, wherein stamping comprises using two dies on opposite sides of the wire and simultaneously striking the wire on opposite sides of the wire.

16. The method of claim 10, wherein forming protrusions comprises punching each wire simultaneously on opposite sides of the wire to compress the wire and drive the material of the wire out to form longitudinal flanges.

17. The method of claim 10, wherein forming the plurality of holes comprises laser machining round holes with a slot at each of four opposing corners of the hole.

18. The method of claim 17, wherein inserting the wires comprises driving the wires through the probe holder and applying a rotation to engage the protrusions in the slots.

* * * * *